United States Patent
VanDerPuy (10) Patent No.: US 9,769,930 B2
(45) Date of Patent: Sep. 19, 2017

(54) MODULE PLACEMENT DEVICE AND METHOD

(71) Applicant: Muth Mirror Systems, LLC, Sheboygan, WI (US)

(72) Inventor: Thomas VanDerPuy, Sheboygan, WI (US)

(73) Assignee: Muth Mirror Systems, LLC, Sheboygan, WI (US)

( * ) Notice: Subject to any disclaimer, the term of this patent is extended or adjusted under 35 U.S.C. 154(b) by 128 days.

(21) Appl. No.: 13/847,262

(22) Filed: Mar. 19, 2013

(65) Prior Publication Data
US 2014/0283973 A1 Sep. 25, 2014

(51) Int. Cl.
*H05K 3/00* (2006.01)
*G05B 19/418* (2006.01)
*H05K 1/02* (2006.01)

(52) U.S. Cl.
CPC ..... *H05K 3/0008* (2013.01); *G05B 19/41805* (2013.01); *H05K 1/0269* (2013.01); *H05K 2201/09918* (2013.01)

(58) Field of Classification Search
CPC .............. B29C 65/7802; B29C 65/782; B29C 66/9261; B29C 66/92611; B29C 66/92613; B29C 66/92615; B32B 41/00; G06T 1/0014; B25J 9/1697; B25J 13/08; B25J 13/088; B25J 13/089; B25J 19/023; H05K 1/0269; H05K 3/0008; H05K 2201/09918
USPC .......................................... 156/64, 362, 367
See application file for complete search history.

(56) References Cited

U.S. PATENT DOCUMENTS

| | | | |
|---|---|---|---|
| 5,380,978 A | 1/1995 | Pryor | |
| 6,000,784 A * | 12/1999 | Takemoto | B41J 2/14 347/50 |
| 6,111,683 A | 8/2000 | Cammenga | |
| 6,167,607 B1 | 1/2001 | Pryor | |
| 2001/0054479 A1* | 12/2001 | Takemoto et al. | 156/275.5 |
| 2006/0279246 A1 | 12/2006 | Hashimoto et al. | |
| 2011/0141381 A1* | 6/2011 | Minikey, Jr. | B60R 1/088 349/11 |
| 2012/0072021 A1 | 3/2012 | Walser et al. | |
| 2012/0152911 A1 | 6/2012 | Diez et al. | |
| 2013/0047396 A1 | 2/2013 | Au et al. | |

OTHER PUBLICATIONS

International Search Report for PCT/US2014/031088 mailed Oct. 6, 2014.
Martin, D. a Practical Guide to Machine Vision Lighting. Feb. 2012 (retrieved Sep. 16, 2014). rerieved from the internet: http://advil.com/uploads/downloads/practicallightingv3.pdf.
Assembly and Test Automation Systems from TQC. Semi Automatic Assembly System with Pallet Track from TQC Ltd. YouTube. Oct. 5, 2011. (retrieved Sep. 16, 2014). Retrieved from internet: http://www.youtube.com/watch?v=W0yRy0gYEOM.
Supplementary European Search Report for EP14770349; mailed Feb. 23, 2017.

* cited by examiner

*Primary Examiner* — George Koch
(74) *Attorney, Agent, or Firm* — Brian G. Gilpin; James A. Joyce; Godfrey & Kahn, S.C.

(57) ABSTRACT

A module placement device and method enable the precision mating of a module to a substrate. The device and method can be effectively used, for example, to mate a light source such as an LED module to the back side of an automotive mirror having portions that permit light to pass therethrough.

2 Claims, 8 Drawing Sheets

MODULE PLACEMENT DEVICE AND METHOD

FIELD OF THE INVENTION

The present invention relates generally to the field of precision automated manufacturing. More particularly, the present invention relates to a device and method for automatically placing a module on the underside of an object using optical cues to align the module to the object.

BACKGROUND AND SUMMARY

Modern automotive mirrors are being called upon to provide more than just a reflective surface for viewing next to or behind the vehicle. In many cases it is desirable to provide the driver with information using the mirror surface but enable the complete mirror surface to be reflective when the information is not being provided. For example, a rear view mirror might include icons indicative of direction, vehicle functions such as telephone use, and other information and a side view mirror may warn a driver that the turn signal is activated or the side view mirror may be connected to a blind spot detection system so that the driver can be warned about a vehicle in the blind spot. In order to achieve a usable mirror surface when the icons are not activated, a number of techniques have been developed. One common technique is to use fine ablations of the reflective surface so that light can pass therethrough but a substantial portion of the reflective surface remains intact. When the light behind the mirror for the icon is activated it passes through the ablation and can be seen and when the light is not activated the mirror effect remains substantially intact.

Certain automotive manufactures desire highly detailed icons to appear in the mirrors, with a high degree of light, and minimal affect on normal mirror operation. To achieve these requirements, mirror manufacturers have found it necessary to precisely align highly-engineered reflectors and light sources (these highly-engineered reflectors and light sources are referred to herein as "modules") behind finely ablated mirrors. Traditionally, these modules have been positioned against the mirror backs by hand but in the manufacturing process this can lead to an unacceptably high level of rejected parts due to failure to meet performance objectives. As such, there is a need for a high-precision device and method to mate a module to a mirror substrate.

The present invention relates to a device and method to precisely mate a highly-engineered light source and reflector module to the rear of a mirror substrate. The device and method include the ability to place the module and substrate into fixtures, reposition at least one of the module and the substrate, and then press the two together so that the module adheres to the rear of the substrate. The device and method could have other applications where similar performance characteristics are desirable.

It will be understood by those skilled in the art that one or more aspects of this invention can meet certain objectives, while one or more other aspects can lead to certain other objectives. Other objects, features, benefits and advantages of the present invention will be apparent in this summary and descriptions of the disclosed embodiment, and will be readily apparent to those skilled in the art. Such objects, features, benefits and advantages will be apparent from the above as taken in conjunction with the accompanying figures and all reasonable inferences to be drawn therefrom.

DETAILED DESCRIPTION

FIGS. 1-3 and 5-13 show one embodiment of a module placement device 100 in accordance with the invention. The module placement device 100 stands on a base 102 and has a protective housing 104. In the embodiment shown, the protective housing 104 includes safety provisions to prevent unintended operation of the module placement device 100 while an operator's hand is near the device. Such safety provisions may include light curtains, emergency stop switches, two hand controls, mechanical guards, or any other suitable means without departing from the invention. Near the module placement device 100 is an operator interface 106 that allows an operator to configure and monitor operation of the module placement device. In the embodiment shown, the operator interface 106 is a touch screen attached to the protective housing 104, but any other user interface may be used without departing from the invention. Alternatively, the user interface may include but are not limited to a computer with keyboard and mouse, or may be replaced by a programmable logic controller or equivalent.

Figure 1:
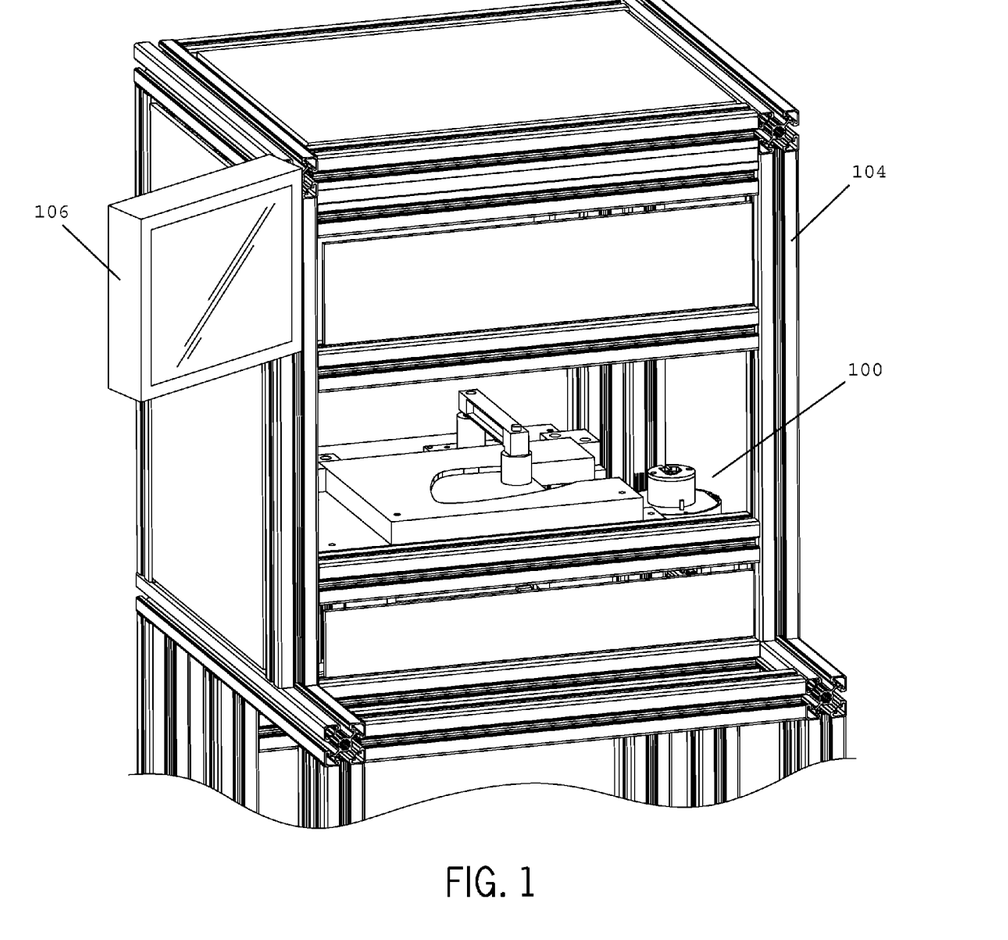
FIG. 1 is a perspective view of one embodiment of a module placement device in accordance with the invention.
Figures 2, 3:
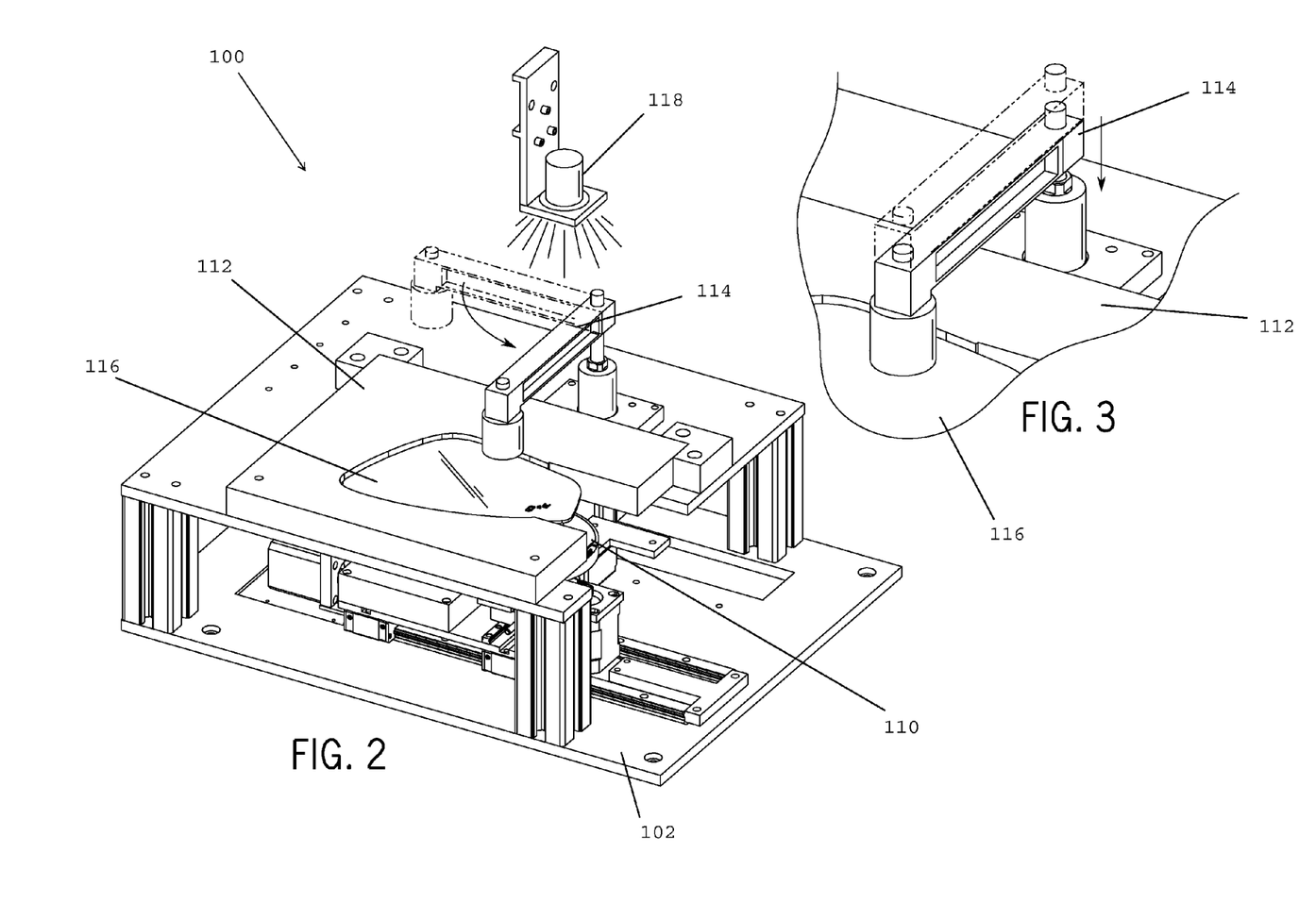
FIG. 2 is another perspective view of the module placement device of FIG. 1 with the protective housing removed.
FIG. 3 is a detail view of the module placement device of FIG. 1 showing the vertical movement of the substrate clamp arm.

Turning now to FIG. 2, a detail view of the module placement device 100 is shown. The module placement device includes a module fixture 110, and a substrate fixture 112. In the embodiment shown, the substrate fixture 112 is for the placement of a blind spot monitor alert light on a side view car mirror, but any suitable substrate may be used without departing from the invention. The module fixture 110 is attached to a plurality of actuators and motors that move the module fixture during the module placement process. The substrate fixture 112, on the other hand, remains stationary throughout the module placement process. Of course, the module fixture 110 could remain stationary while the substrate fixture 112 moves without departing from the invention. As shown in greater detail in FIG. 3, a substrate clamp arm 114 is located near the substrate fixture 112 that secures a substrate 116 to the substrate fixture during the module placement process. A camera 118 is positioned above the module fixture 110.

The operator interface 106, module fixture 110, and camera 118 are connected to a controller that controls the operation of the module placement device 100. In the embodiment shown, the controller includes a processor, memory, and program that moves the module fixture 110 based on images captured by the camera 118. A program is loaded into the controller based on the geometry of the substrate and the module being placed.

Figure 4:
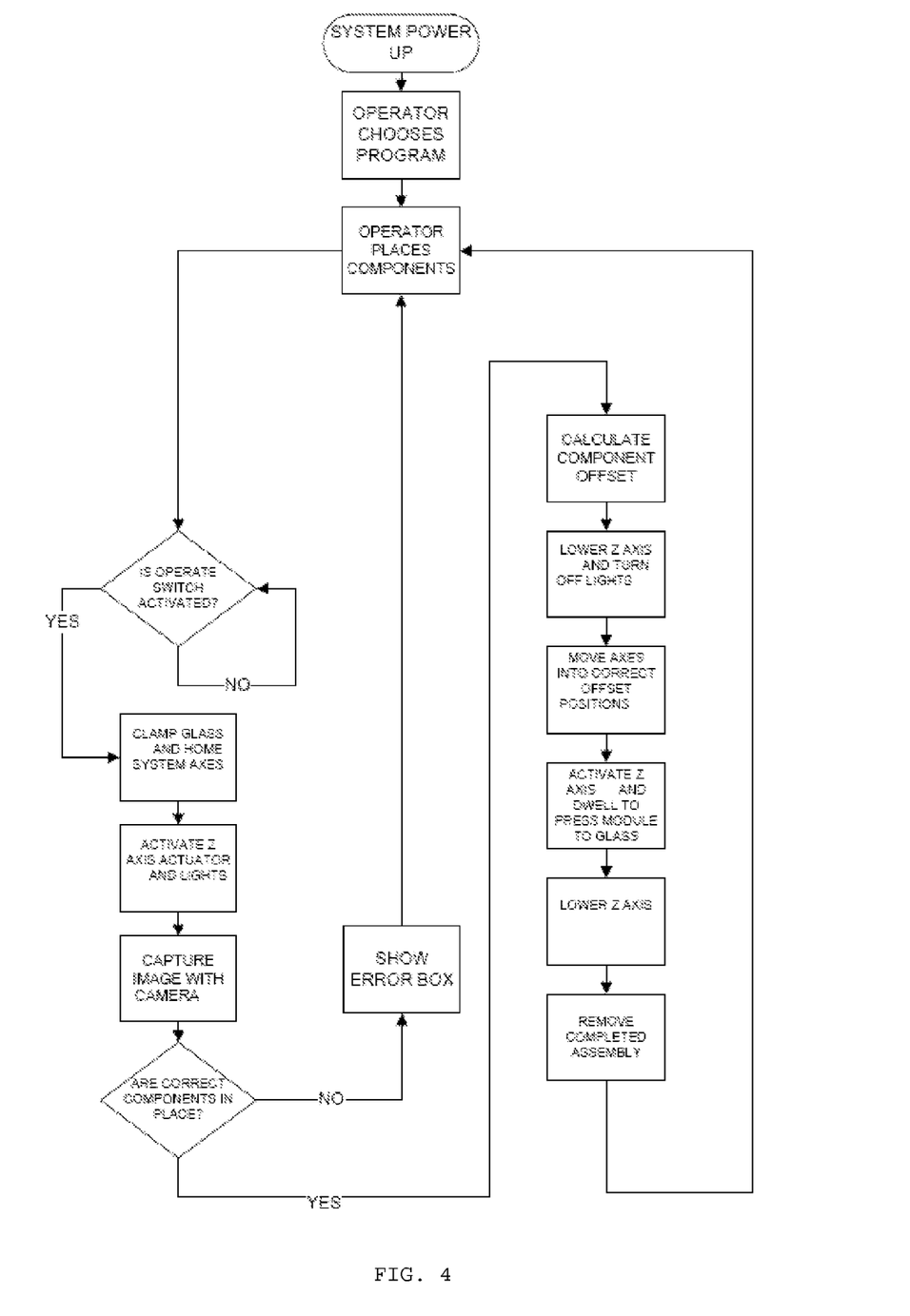
FIG. 4 is a flow chart depicting an operation sequence of a device and method in accordance with one embodiment of the invention.
Figure 5:
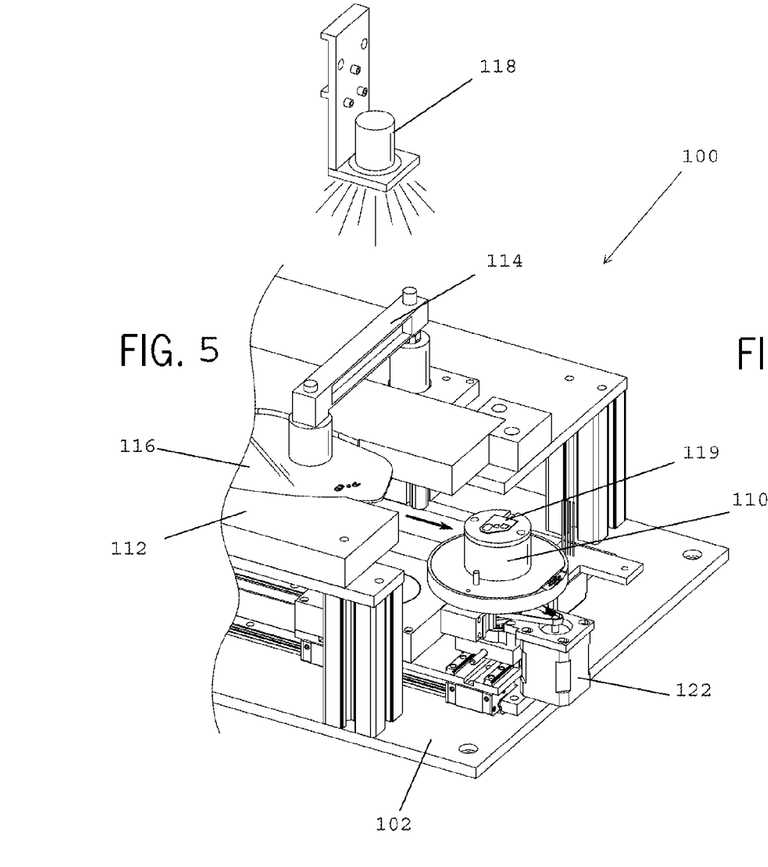
FIG. 5 is another detail view of the module placement device of FIG. 1 showing the initial horizontal movement of the module fixture.
Figure 6:
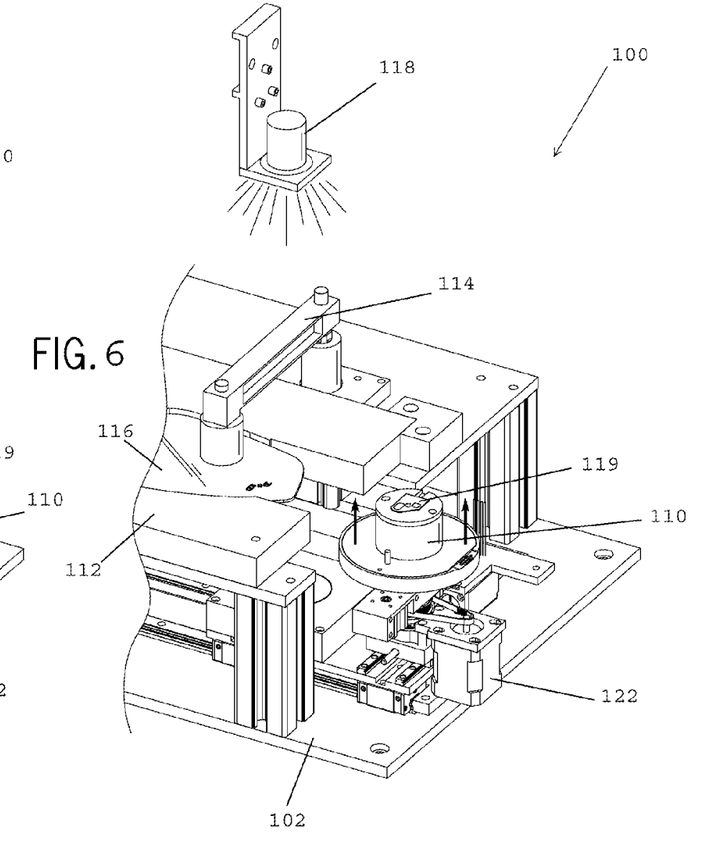
FIG. 6 is another detail view of the module placement device of FIG. 1 showing the calibrating vertical movement of the module fixture.

Turning now to FIGS. 4-11, one cycle of the operation of the module placement device 100 is shown. FIG. 4 is a flowchart showing a typical module placement cycle. FIGS. 5-11 show the module placement device 100 in various stages of the module placement cycle. The module placement device 100 works by visually identifying landmarks on the substrate 116 and a module 119 to automatically and precisely align the substrate and module together. In the embodiment shown, the module 119 has an adhesive face that permanently bonds to the substrate 116 when the module is pressed onto it. Of course, the module 119 could be non-adhesive, with adhesive on the substrate 116 without departing from the invention. Just prior to the start of an operation cycle of the module placement device 100, an operator places a module 119 in the module fixture 110. Next, the operator starts the module placement device 100 by pressing a button on the operator interface 106 or by any other suitable means. FIG. 5 shows the movement of the module fixture 110 into a position beneath the camera 118. Next, as shown in FIG. 6, the module fixture 110 raises to the height of the substrate 116. The camera 118 is focused on both the substrate 116 and the module 119 and the controller, based on the image captured by the camera when the module fixture is raised to the height of the substrate 116, calculates the position of the module relative to the substrate. In the embodiment shown, the controller recognizes landmarks on the module 119 and the substrate 116 and uses software to calculate how to align them to each other. Multiple cameras could be used without departing from the invention.

Figure 7:
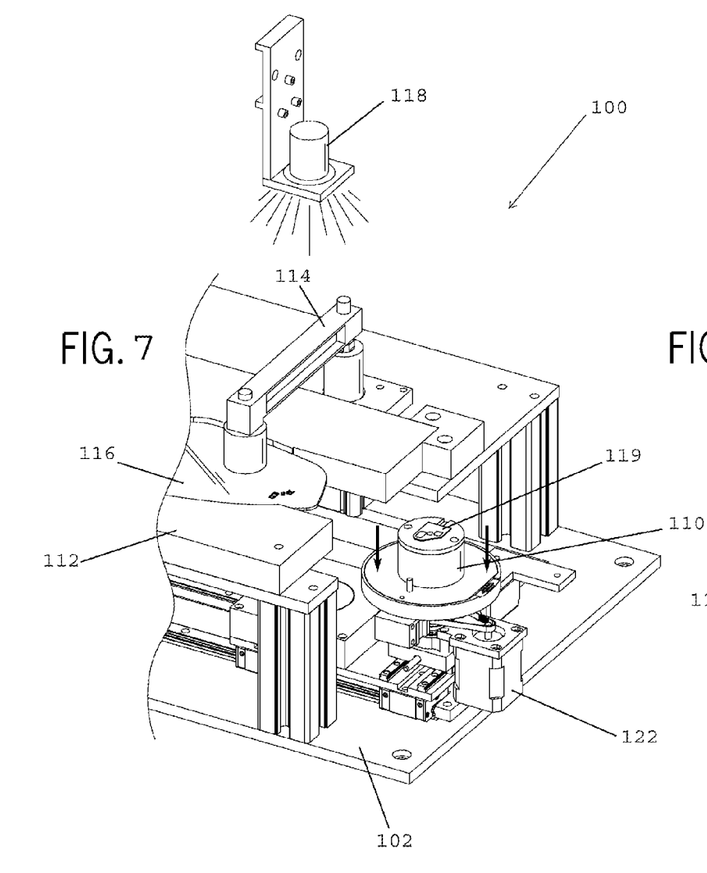
FIG. 7 is another detail view of the module placement device of FIG. 1 showing the lowering of the module fixture before placement of the module.
Figure 8:
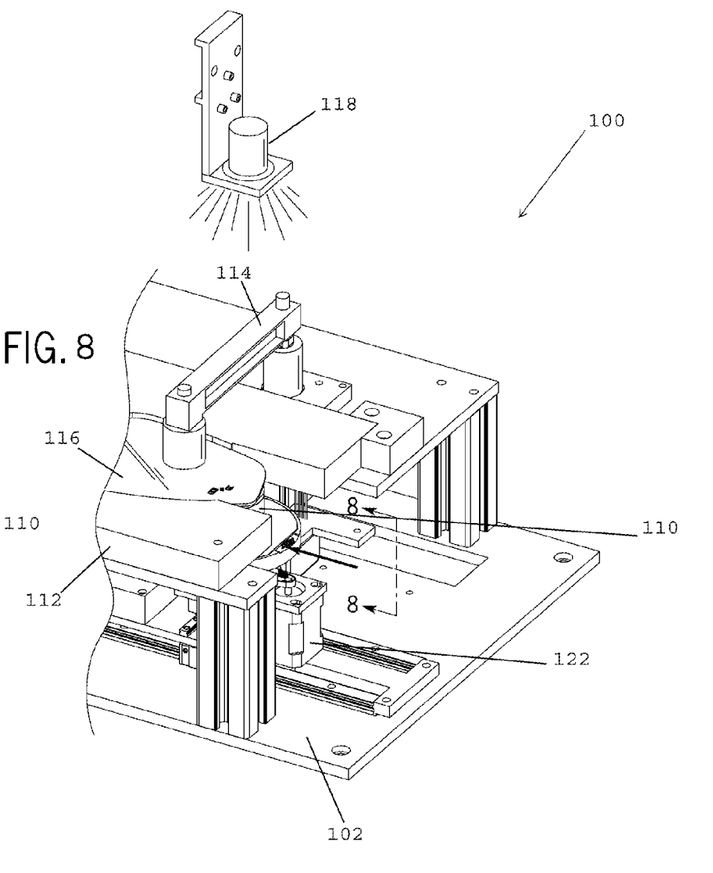
FIG. 8 is another detail view of the module placement device of FIG. 1 showing the movement of the module fixture into placement position.

Turning now to FIG. 7, the controller moves the module fixture 110 back to a descended position so it can move beneath the substrate. At the same time, the controller moves the module fixture 110 based on the calculation described above so that the module 119 is properly aligned with the substrate 116. FIG. 8 shows the movement of the module fixture 110 into position beneath the substrate 116.

Figure 9:
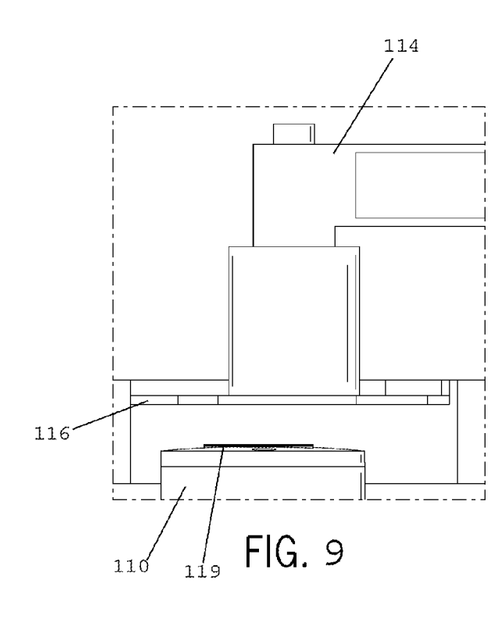
FIGS. 9-11 are side section views of the module placement device of FIG. 1 taken generally along the line 8-8 in FIG. 7 showing placement of the module onto the substrate.
Figure 10:
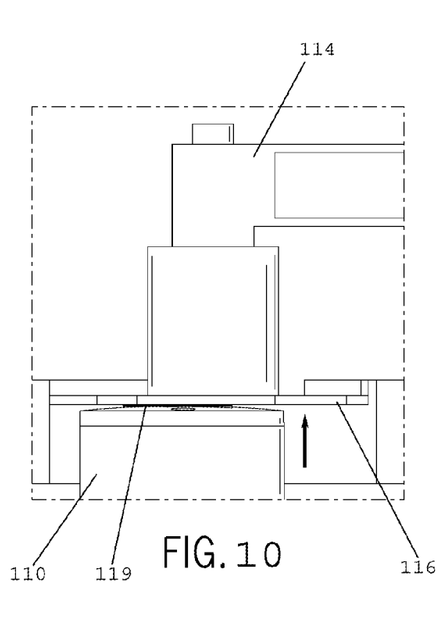
Figure 11:
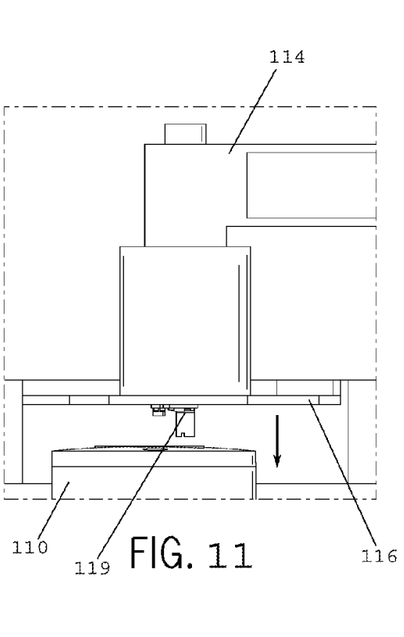
Figure 12:
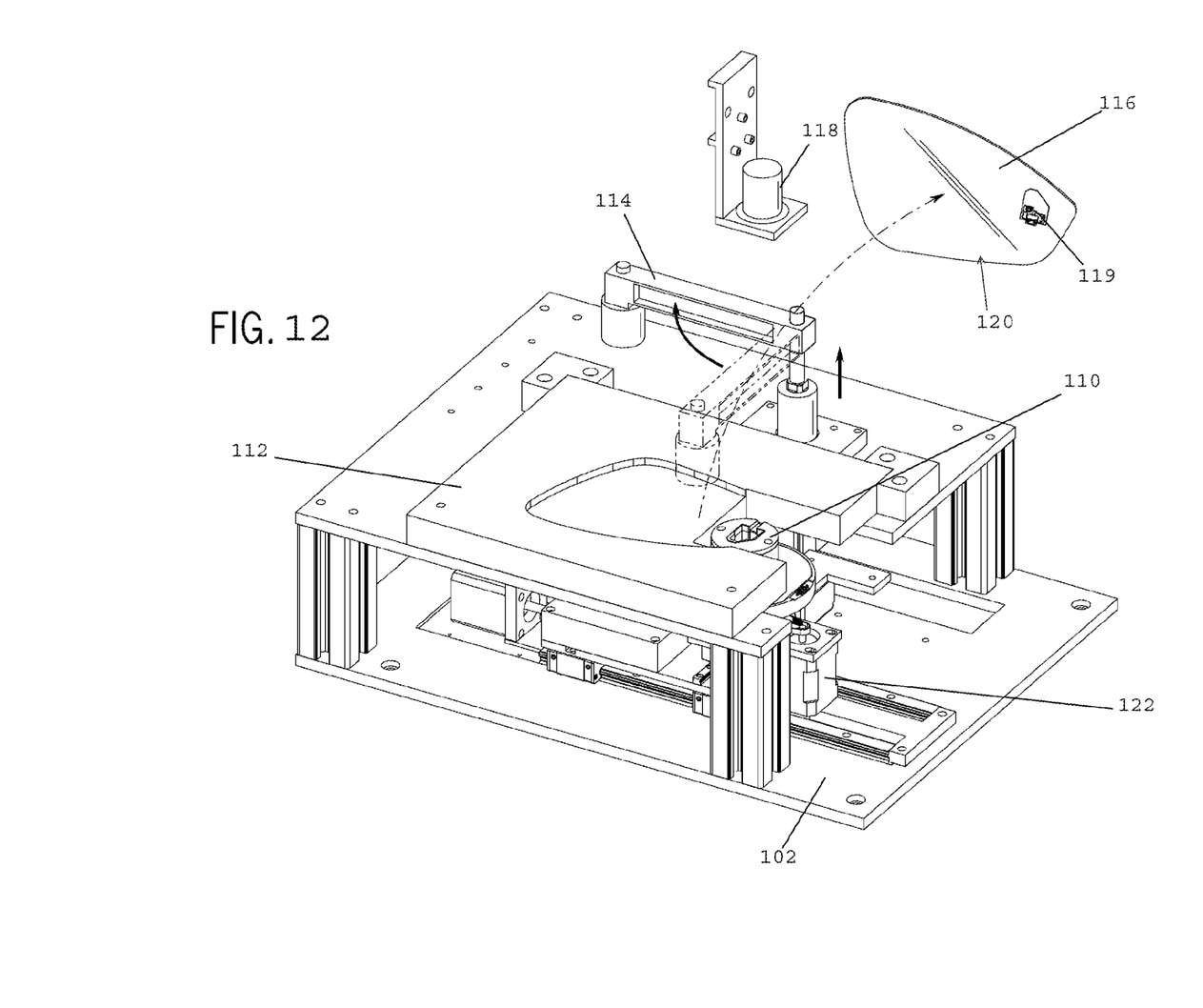
FIG. 12 is another detail view of the module placement device of FIG. 1 showing removal of the substrate with the module attached.

FIGS. 9-11 show how the module 119 is placed on the substrate 116. In FIG. 9, the module fixture 110 is positioned beneath the substrate and in position to be affixed to the substrate. FIG. 10 shows the module fixture 110 raised so that the module 119 is pressed onto the substrate 116. FIG. 11 shows the module fixture 110 descending back to its position in FIG. 9, with the module 119 affixed to the substrate 116. After the module 119 is affixed to the substrate 116, the substrate clamp arm 114 raises and swings away, allowing the operator to remove the now completed part 120 (FIG. 12).

Figure 13:
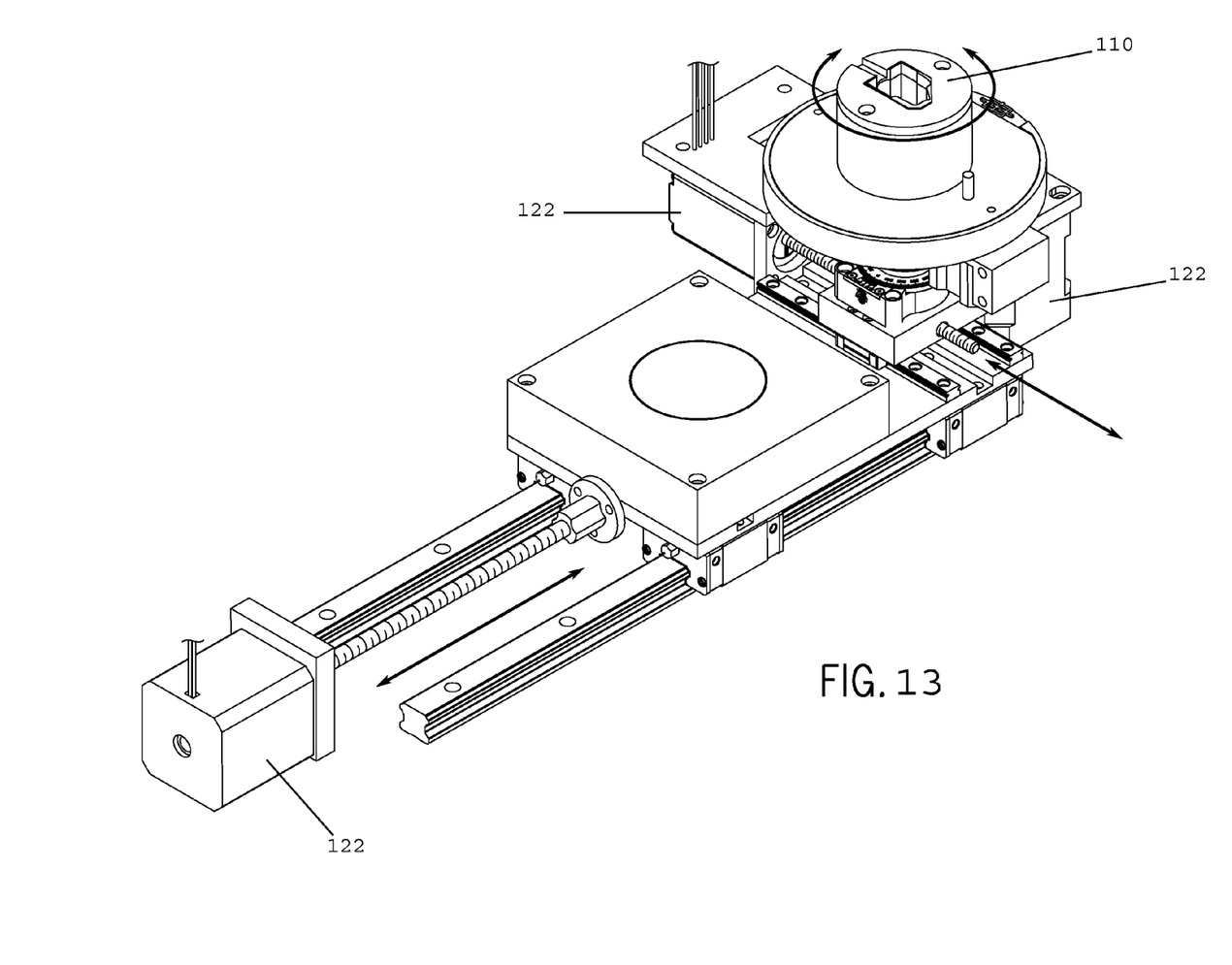
FIG. 13 is another detail view of the module placement device of FIG. 1 showing the degrees of movement of the module fixture.

FIG. 13 shows the module fixture 110 in greater detail. In the embodiment shown, the module fixture is movable in four directions. The module fixture 110 is movable in the X, Y, and Z axes, as well as a rotational axis around the Z axis. Providing four axes of available movement allows the module 119 to be precisely placed on the substrate 116. In the embodiment shown, three stepper motors 122 and a linear actuator control the movement of the module fixture 110. The stepper motors 122 control X, Y, and rotational position, and the linear actuator controls the position of the module fixture 110 along the Z axis. Using stepper motors 122 allows precision control of the position of the module fixture 110, but any other suitable means may be used without departing from the invention.

Although the invention has been herein described in what is perceived to be the most practical and preferred embodiments, it is to be understood that the invention is not intended to be limited to the specific embodiments set forth above. Rather, it is recognized that modifications may be made by one of skill in the art of the invention without departing from the spirit or intent of the invention and, therefore, the invention is to be taken as including all reasonable equivalents to the subject matter of the appended claims and the description of the invention herein.

What is claimed is:

1. A module placement device for securing a module having an LED light source and a reflector on a mirror substrate, the module placement device comprising:
   a mirror substrate fixture for at least partially securing the mirror substrate;
   a module fixture positionable by a plurality of repositioning actuators, the module fixture being moveable by the repositioning actuators with respect to the mirror substrate fixture, the module fixture capable of holding the module, pressing the module against the mirror substrate at a location thereof having a portion ablated so as to permit light to pass therethrough, and releasing the module;
   an adhesive situated on at least one of the module and the mirror substrate for securement of the module to the mirror substrate when pressed in place;
   a controller connected to the plurality of repositioning actuators for controlling the movement of the repositioning actuators, wherein the controller includes a processor, a memory, and a program in communication with the controller memory, wherein the program includes the geometry of the module and the mirror substrate, and wherein the controller is configured for controlling movement of the repositioning actuators based at least in part by the geometry provided by the program;
   a camera in communication with the controller and in line of sight position with respect to at least a portion of the mirror substrate and at least a portion of the module, wherein the camera is configured to capture one or more images of the at least a portion of the mirror substrate and the at least a portion of the module when the module has been moved by the module fixture along a Z-axis to the height of the substrate; and
   wherein the controller is configured to receive and process the images to determine the relative position of the module and the mirror substrate through visual identification of landmarks on the mirror substrate and module, and to compare the relative position of the module and the mirror substrate to a desired relative position, and calculate the necessary actuation of the repositioning actuators along an X-axis, a Y-axis, a Z-axis, and a rotational axis around the Z-axis in order to obtain the desired relative position, and wherein the controller is programmed to lower the module fixture along the Z-axis and actuate the repositioning actuators so as to move the module into the desired relative position by adjustment of the module along the X-axis, the Y-axis, and the rotational axis around the Z-axis, and to raise the module along the Z-axis a subsequent time in order to press the module against the mirror substrate.

2. A method of securing a module having a light source and a reflector on a mirror substrate comprising:
- at least partially securing the mirror substrate to a mirror substrate fixture;
- securing the module to a module fixture, wherein the module fixture is capable of securing the module, pressing the module against the mirror substrate, so as to secure the module to the mirror substrate by direct securement of the module to the mirror substrate with an adhesive, and releasing the module, and wherein the module fixture is positionable by a plurality of repositioning actuators;
- controlling the movement of the repositioning actuators, via a controller in communication with the plurality of repositioning actuators, wherein the controller includes a processor, a memory, and a program, wherein the program includes the geometry of the module and the mirror substrate, and wherein the controller is configured for controlling movement of the repositioning actuators based at least in part by the geometry provided by the program;
- raising the module via the module fixture along a Z-axis to the height of the substrate;
- capturing one or more images of at least a portion of the mirror substrate and at least a portion of the module;
- receiving and processing the images to determine the relative position of the module and the mirror substrate through visual identification of landmarks on the mirror substrate and module, and comparing the relative position of the module and the mirror substrate to a desired relative position;
- calculating the necessary actuation of the repositioning actuators along an X-axis, a Y-axis, a Z-axis, and a rotational axis around the Z-axis in order to obtain the desired relative position;
- lowering the module fixture along the Z-axis using the repositioning actuators and further actuating the repositioning actuators so as to move the module into the desired relative position along the X-axis, the Y-axis, and the rotational axis around the Z-axis; and
- raising the module along the Z-axis to the desired relative position in order to press the module against the mirror substrate.

* * * * *